(12) United States Patent
Li et al.

(10) Patent No.: US 9,601,084 B2
(45) Date of Patent: Mar. 21, 2017

(54) ARRAY SUBSTRATE AND DISPLAY PANEL

(71) Applicant: BOE TECHNOLOGY GROUP CO., LTD., Beijing (CN)

(72) Inventors: Wenbo Li, Beijing (CN); Pan Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 14 days.

(21) Appl. No.: 14/415,495

(22) PCT Filed: Jun. 30, 2014

(86) PCT No.: PCT/CN2014/081203
§ 371 (c)(1),
(2) Date: Jan. 16, 2015

(87) PCT Pub. No.: WO2015/109757
PCT Pub. Date: Jul. 30, 2015

(65) Prior Publication Data
US 2016/0019864 A1 Jan. 21, 2016

(30) Foreign Application Priority Data
Jan. 26, 2014 (CN) .......................... 2014 1 0038049

(51) Int. Cl.
G09G 5/10 (2006.01)
G02F 1/1345 (2006.01)
(Continued)

(52) U.S. Cl.
CPC ........... *G09G 5/10* (2013.01); *G02F 1/13454* (2013.01); *G02F 1/136227* (2013.01);
(Continued)

(58) Field of Classification Search
CPC ............ G02F 1/13452; G02F 1/13454; G02F 1/13306; G02B 6/43; G09G 2320/0233;
(Continued)

(56) References Cited

U.S. PATENT DOCUMENTS 6,529,179 B1 3/2003 Hashimoto et al.
7,605,899 B2 10/2009 Shikina et al.
(Continued)

FOREIGN PATENT DOCUMENTS

CN 100341158 C 10/2007
CN 101093848 A 12/2007
(Continued)

OTHER PUBLICATIONS

Search Report issued in International Application No. PCT/CN2014/081203, dated Jun. 30, 2014 (Jun. 30, 2014).
(Continued)

*Primary Examiner* — Sanjiv D Patel
(74) *Attorney, Agent, or Firm* — Nath, Goldberg & Meyer; Joshua B. Goldberg; Leonid D. Thenor

(57) ABSTRACT

The present invention provides an array substrate and a display panel. The array substrate comprises a base substrate comprising a first surface and a second surface which is opposite to the first surface, and a pixel circuit arranged on the first surface of the base substrate, wherein the array substrate further comprises a driving circuit, which is arranged on the second surface of the base substrate and is in signal connection with the pixel circuit. The present invention further provides a display panel comprising the array substrate. In the present invention, the driving circuit provides an electrical drive signal required for display to the pixel circuit, and both the driving circuit and the pixel circuit are integrated on the base substrate of the array substrate,
(Continued)

thereby improving the degree of integration of the array substrate and reducing the total volume of the display panel.

11 Claims, 3 Drawing Sheets

(51) Int. Cl.
- *G02F 1/1362* (2006.01)
- *H01L 23/538* (2006.01)
- *H01L 27/15* (2006.01)
- *H01L 27/30* (2006.01)
- *H01L 27/32* (2006.01)
- *G09G 3/32* (2016.01)

(52) U.S. Cl.
CPC ....... *G09G 3/3208* (2013.01); *H01L 23/5384* (2013.01); *H01L 27/156* (2013.01); *H01L 27/305* (2013.01); *H01L 27/3227* (2013.01); *H01L 27/3276* (2013.01); *G09G 2360/141* (2013.01); *G09G 2360/144* (2013.01); *H01L 2924/0002* (2013.01)

(58) Field of Classification Search
CPC .. G09G 3/3225; G09G 3/3233; G09G 3/3426; G09G 2310/027; G09G 2320/0247; G09G 2330/025; G09G 2330/028; G09G 3/2014; G09G 3/22; G09G 3/3208; G09G 3/36; G09G 3/3648; G09G 2360/141; G09G 2360/144; G09G 5/10; H01L 23/5384; H01L 27/156; H01L 27/305; H01L 27/3227; H01L 27/3276; H01L 31/00; H01L 31/08; H01L 31/10

See application file for complete search history.

(56) References Cited

U.S. PATENT DOCUMENTS

| 2004/0007706 A1* | 1/2004 | Yamazaki | G02B 6/43 257/79 |
| 2011/0176199 A1* | 7/2011 | Sakurai | G02F 1/167 359/296 |
| 2013/0200409 A1* | 8/2013 | Abe | H01L 33/62 257/91 |
| 2013/0207933 A1* | 8/2013 | Mamba | G06F 3/046 345/174 |
| 2015/0169011 A1* | 6/2015 | Bibl | G06F 3/0412 345/175 |

FOREIGN PATENT DOCUMENTS

| CN | 201215617 Y | 4/2009 |
| CN | 201533301 U | 7/2010 |
| CN | 201886231 U | 6/2011 |
| CN | 203085140 U | 7/2013 |
| CN | 103810981 A | 5/2014 |
| JP | 2001-134238 A | 5/2001 |
| JP | 2004078971 A | 3/2004 |

OTHER PUBLICATIONS

Form PCT/ISA/237 issued in International application No. PCT/CN2014/081203 mailed Sep. 30, 2014.

1st Office Action issued in Chinese application No. 201410038049.6 issued Jul. 1, 2015.

* cited by examiner

ARRAY SUBSTRATE AND DISPLAY PANEL

This is a National Phase Application filed under 35 U.S.C. 371 as a national stage of PCT/CN2014/081203, filed Jun. 30, 2014, an application claiming the benefit to Chinese Application No. 201410038049.6, filed Jan. 26, 2014; the content of each of which is hereby incorporated by reference in its entirety.

FIELD OF THE INVENTION

The present invention relates to the field of display, and particularly to an array substrate and a display panel including the array substrate.

BACKGROUND OF THE INVENTION

Generally, a display panel includes an array substrate and a driving circuit module. A pixel circuit is arranged on the array substrate and the driving circuit module is electrically connected with the array substrate to provide a driving signal for the pixel circuit on the array substrate.

FIG. 1 is a schematic diagram of a display panel in the prior art, showing a driving circuit module of an array substrate. As shown in FIG. 1, in general, the array substrate 10 and the driving circuit 20 are electrically connected through a flexible circuit board 30. A space for accommodating the flexible circuit board and the driving circuit module must be provided in the display panel, which makes the display panel generally have a relatively large volume.

Integration is an important development trend of display technology, and therefore, how to reduce the volume of the display panel becomes a technical problem to be solved urgently in the field.

SUMMARY OF THE INVENTION

An object of the present invention is to provide an array substrate with relatively high degree of integration and a display panel including the array substrate.

In order to realize the above object, as one aspect of the present invention, there is provided an array substrate which includes a base substrate and a pixel circuit, the base substrate includes a first surface and a second surface which is opposite to the first surface, the pixel circuit is arranged on the first surface of the base substrate, wherein the array substrate further includes a driving circuit, which is arranged on the second surface of the base substrate and is in signal connection with the pixel circuit.

Preferably, at least a part of the base substrate is a transparent part, the array substrate further includes an electro-optical conversion unit arranged on the second surface of the base substrate and a photoelectric conversion unit arranged on the first surface of the base substrate, both the electro-optical conversion unit and the photoelectric conversion unit are arranged on the transparent part, the electro-optical conversion unit is electrically connected with the driving circuit to convert an electrical drive signal output by the driving circuit into an optical signal, and the photoelectric conversion unit is electrically connected with the pixel circuit and can receive the optical signal converted by the electro-optical conversion unit and restore the optical signal to an electrical signal which is the same as the electrical drive signal output by the driving circuit.

Preferably, a wavelength of the optical signal is not less than that of infrared light.

Preferably, the electro-optical conversion unit includes an electroluminescent element.

Preferably, a first anode of the electroluminescent element is arranged on the second surface.

Preferably, the photoelectric conversion unit includes a photoelectric diode, and an operational amplifier and a first auxiliary resistor which are connected with the photoelectric diode, wherein a second anode of the photoelectric diode is arranged on the first surface, the second anode of the photoelectric diode is connected with one terminal of the first auxiliary resistor, a second cathode of the photoelectric diode is connected with a high-level output terminal, the other terminal of the first auxiliary resistor is grounded, a positive input terminal of the operational amplifier is connected with the one terminal of the first auxiliary resistor, a negative input terminal of the operational amplifier is connected with the other terminal of the first auxiliary resistor, and an input terminal of the pixel circuit is connected with an output terminal of the operational amplifier.

Preferably, the photoelectric conversion unit includes a photoelectric triode and a second auxiliary resistor, wherein one terminal of the second auxiliary resistor is connected with a high-level output terminal, the other terminal of the second auxiliary resistor is connected with a drain of the photoelectric triode, a source of the photoelectric triode is arranged on the first surface, the source of the photoelectric triode is connected with a grounding terminal of the pixel circuit and the drain of the photoelectric triode is connected with an input terminal of the pixel circuit.

Preferably, the driving circuit and the pixel circuit are electrically connected through a via hole penetrating through the base substrate.

As another aspect of the present invention, there is provided a display panel including an array substrate, wherein the array substrate is the above array substrate provided by the present invention.

Preferably, the display panel is a reflective liquid crystal display panel; or the display panel includes a self-luminous display device.

In the present invention, the driving circuit provides the electrical drive signal required for display to the pixel circuit, and both the driving circuit and the pixel circuit are integrated on the base substrate of the array substrate, thereby improving the degree of integration of the array substrate and further reducing the total volume of the display panel.

BRIEF DESCRIPTION OF THE DRAWINGS

The accompanying drawings are used to give a further understanding of the present invention and constitute a part of the description. The accompanying drawings, together with the following embodiments, are used for explaining the present invention rather than limiting the present invention. In the drawings.

Figure 1:
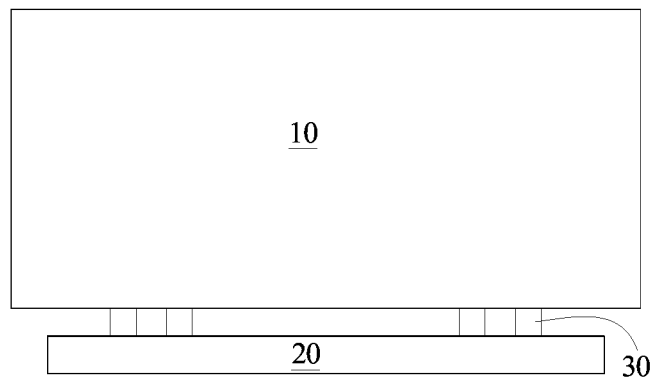
FIG. 1 is a schematic diagram of a display panel in the prior art, showing a driving circuit module of an array substrate.

| Description of reference numerals | |
|---|---|
| 10: array substrate | 11: base substrate |
| 12: pixel circuit | 20: driving circuit |
| 30: flexible circuit board | 40: photoelectric conversion unit |
| 41: photoelectric diode | 42: photoelectric triode |
| 411: second anode | 412: PN junction |
| 413: second cathode | 421: source |
| 422: first organic photoelectric layer | 423: gate |
| 424: second organic photoelectric layer | 425: drain |
| 43: operational amplifier | 44: first auxiliary resistor |
| 45: second auxiliary resistor | 50: electro-optical conversion unit |
| 51: first anode | 52: hole transporting layer |
| 53: light-emitting layer | 54: hole blocking layer |
| 55: electron transporting layer | 56: first cathode |
| 57: cathode protection layer | |

DETAILED DESCRIPTION OF THE EMBODIMENTS

Embodiments of the present invention will be described in detail in combination with the drawings below. It should be understood that the specific embodiments described herein are merely used for describing and explaining the present invention rather than limiting the present invention. Throughout the description, the same numerals refer to the same components. In the drawings, for clarity, thicknesses of layers and regions may be exaggerated.

It should also be understood that, although terms, such as first, second and the like can be used herein for describing elements, these elements should not be limited by these terms. These terms are only used for distinguishing one element from another element. Thus, for example, a first element, a first component or a first part discussed below can be called a second element, a second component or a second part without departing from the teachings of the concepts of the present invention.

In addition, for ease of description, spatially relative terms, such as "below", "above", "over", "upper side" and the like are used herein to facilitate description of the relation between one element or feature and another (some other) element(s) or feature(s) as shown in the figures. It would be understood that, in addition to the directions illustrated in the figures, these spatially relative terms are intended to include different directions of devices in use or operation. For example, if a device in a figure is turned over, an element described as "above" or "over" other element(s) or feature(s) will be positioned as "below" the other element(s) or feature(s). Thus, the exemplary term "above" can simultaneously include the orientations of above and below. The device can be positioned in other ways (rotated by 90 degrees or positioned in other positions) and the spatially relative descriptors used herein are correspondingly explained. It should also be understood that, when a layer or an element is described as being arranged "on" another layer or base, it can be directly arranged on the other layer or base, or an intermediate layer may exist. On the contrary, when a layer or an element is described as being arranged "directly on" another element, no intermediate element exists.

Figure 2:
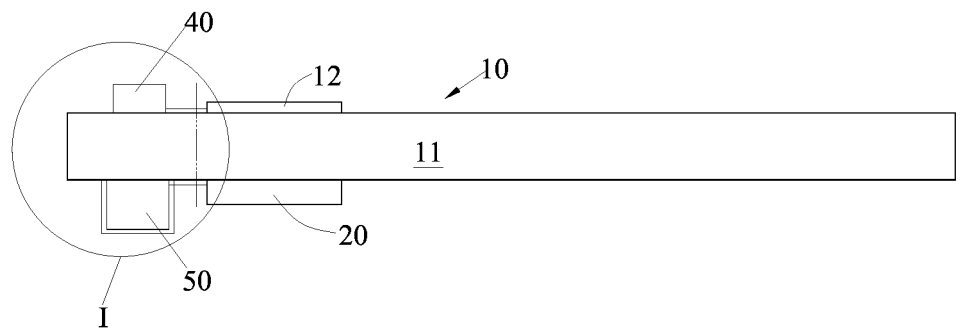
FIG. 2 is a schematic diagram of an array substrate provided by the present invention.

As shown in FIG. 2, as one aspect of the present invention, an array substrate 10 is provided, and includes a base substrate 11 including a first surface and a second surface opposite to the first surface, and a pixel circuit 12 is arranged on the first surface, wherein the array substrate 10 further includes a driving circuit 20, which is arranged on the second surface and is in signal connection with the pixel circuit 12.

In the present invention, the driving circuit 20 is used for providing an electrical drive signal required for display to the pixel circuit 12, and both the driving circuit 20 and the pixel circuit 12 are integrated on the base substrate 11, thereby improving the degree of integration of the array substrate and further reducing a total volume of the display panel.

In the present invention, the form of signal connection between the driving circuit 20 and the pixel circuit 12 is not specifically limited, as long as the electrical drive signal output by the driving circuit 20 can be transferred to the pixel circuit 12. The signal connection can be in a form of physical contact connection and can also be in a form of non-physical contact connection.

For example, as an example of the physical contact connection, the driving circuit 20 and the pixel circuit 12 can be electrically connected through a flexible circuit board, or the driving circuit 20 and the pixel circuit 12 can be electrically connected through a via hole penetrating through the base substrate 11.

As a preferred implementation of the present invention, the driving circuit 20 and the pixel circuit 12 may be in signal connection in a non-physical contact manner, so that the volume of the array substrate can be further reduced. For example, the driving circuit 20 and the pixel circuit 12 may be in signal connection by means of photoelectric conversion. Specifically, at least a part of the base substrate 11 can be form into a transparent part. In the preferred implementation, as shown in FIG. 2, one end of the base substrate 11 is configured to be the transparent part (the part on the left side of the two dot chain line in FIG. 2). The array substrate 10 can also include an electro-optical conversion unit 50 arranged on the second surface and a photoelectric conversion unit 40 arranged on the first surface, and both the electro-optical conversion unit 50 and the photoelectric conversion unit 40 are arranged on the transparent part. The electro-optical conversion unit 50 and the driving circuit 20 are electrically connected to convert the electrical drive signal output by the driving circuit 20 into an optical signal; the photoelectric conversion unit 40 and the pixel circuit 12 are electrically connected; the photoelectric conversion unit 40 can receive the optical signal converted by the electro-optical conversion unit 50 and restore the optical signal to an electrical signal which is the same as the electrical drive signal output by the driving circuit 20.

Figure 3:
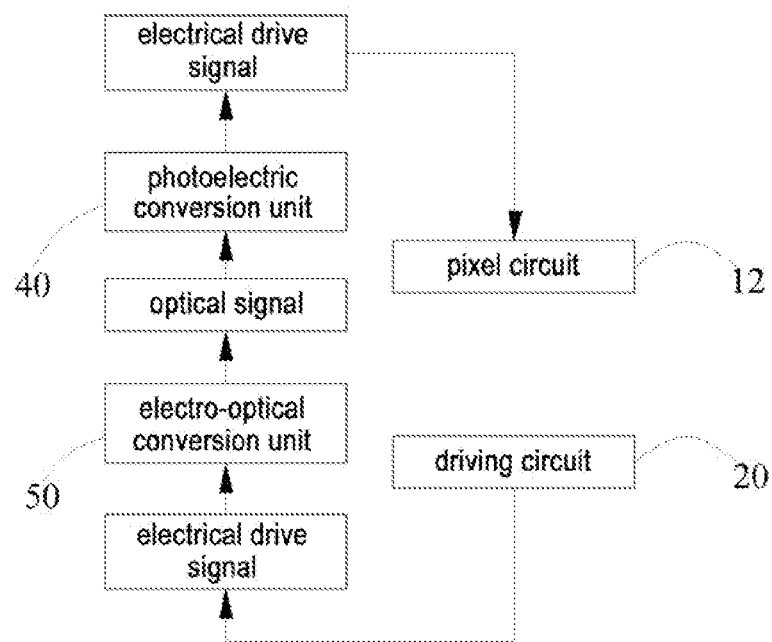
FIG. 3 is a diagram showing the working principle of the array substrate as shown in FIG. 2.

FIG. 3 shows a working principle diagram of the array substrate including the electro-optical conversion unit 50 and the photoelectric conversion unit 40. Firstly, the driving circuit 20 provides the electrical drive signal to the electro-optical conversion unit 50, the electro-optical conversion unit 50 converts the received electrical drive signal into the optical signal, the optical signal reaches the photoelectric conversion unit 40 after passing through the transparent part, the photoelectric conversion unit 40 can restore the optical signal to the electrical signal which is the same as the electrical drive signal output by the driving circuit 20 and transfer the electrical signal to the pixel circuit 12.

In the present invention, the specific form of the optical signal produced by the electro-optical conversion unit 50 is not specifically limited, as long as the optical signal meets the following two conditions: 1) the optical signal can be received by the photoelectric conversion unit 40; and 2) the optical signal can be restored to the electrical signal by the photoelectric conversion unit 40.

Preferably, a wavelength of the optical signal is not less than that of infrared light, thereby preventing the optical signal from interfering the display of a display region and further improving the viewing experience of a user.

In addition, in the present invention, a specific structure of the electro-optical conversion unit 50 is not specifically limited, as long as the electrical drive signal can be converted into the optical signal by the electro-optical conversion unit 50. For example, the electro-optical conversion unit 50 can include an electroluminescent element, which includes at least one of a light-emitting diode, a quantum dot light-emitting element and a fluorescent powder light-emitting element.

Figure 4:
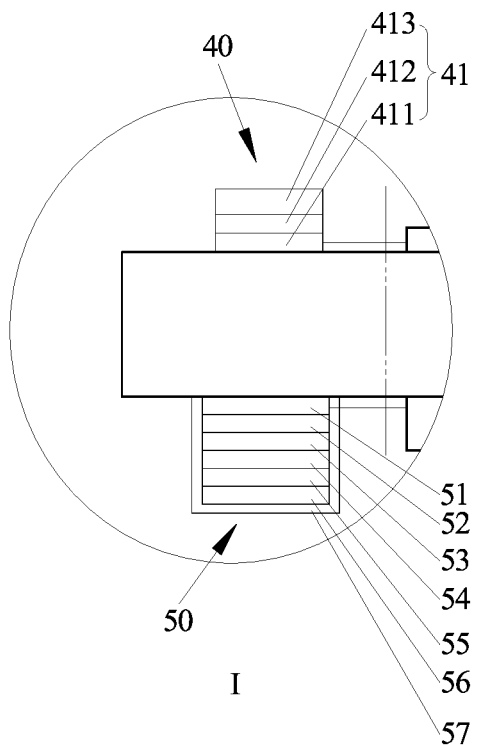
FIG. 4 is an enlarged view of part I in FIG. 2, showing a first implementation of a photoelectric conversion unit and a specific configuration of an electro-optical conversion unit.
Figure 6:
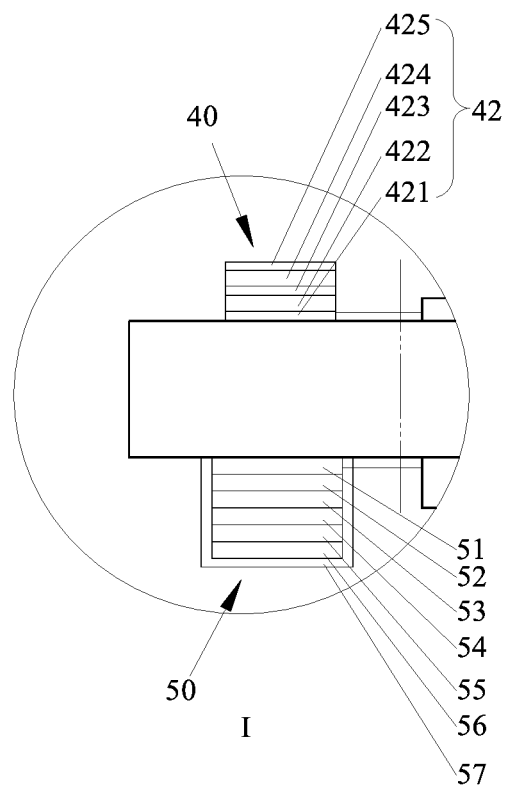
FIG. 6 is an enlarged view of part I in FIG. 2, showing a second implementation of the photoelectric conversion unit and a specific configuration of the electro-optical conversion unit.

The electro-optical conversion unit 50 as shown in each of FIGS. 4 and 6 is a light-emitting diode. As shown in the figures, a first anode 51, a hole transporting layer 52, a light-emitting layer 53, a hole blocking layer 54, an electron transporting layer 55 and a first cathode 56 are sequentially arranged on the second surface of the transparent part of the substrate from top to bottom, thereby jointly constituting the light-emitting diode as the electro-optical conversion unit 50 in the present embodiment.

As described above, preferably, in order to prevent the optical signal from affecting the display in the display region, the wavelength of the optical signal should be no less than that of the infrared light. In order to realize the purpose, preferably, the light-emitting diode can be an organic light-emitting diode, and the light-emitting layer 53 of the light-emitting diode can be prepared from a rare earth element organic complex. For example, a series of rare earth organic complexes can be produced by utilizing trivalent rare earth erbium ions ($Er^{3+}$) which emit light in an infrared region to react with ligands of ring type organic matters. The trivalent rare earth erbium ions ($Er^{3+}$) have relatively good compatibility with organic compounds, polymer materials and the like, and thus are applicable to the organic light-emitting diodes for emitting the infrared light. As a specific implementation of the present invention, the rare earth element organic complex can be $Er(AcAc)_3$ phen, (namely

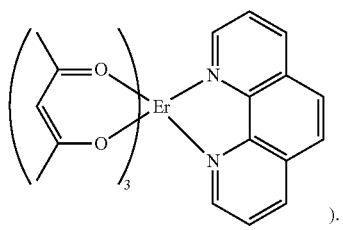

).

Alternatively, the light-emitting layer 53 can have a multi-layer structure of $Alq_3$: CuPc/DCM, wherein $Alq_3$ is 8-hydroxyquinoline aluminum, CuPc is phthalocyanine blue and DCM is red fluorescent dye. Thus, the entire structure of the light-emitting diode can be first anode 51/NPB (35 nm) (hole transporting layer 52)/$Alq_3$: CuPc/DCM (32 nm) (light-emitting layer 53)/BCP (15 nm) (hole blocking layer 54)/$Alq_3$ (20nm) (electron transporting layer 55)/Al (first cathode 56), wherein $Alq_3$ is 8-hydroxyquinoline aluminum, CuPc is phthalocyanine blue and DCM is red fluorescent dye.

In order to improve the utilization rate of light emitted by the light-emitting diode and protect the light-emitting diode, preferably, the electro-optical conversion unit 50 can further include a cathode protection layer 57 covering the light-emitting diode. The first anode 51 of the light-emitting diode is made of a transparent electrode material, while the cathode protection layer 57 can be made of a non-photosensitive polyimide material so that the cathode protection layer 57 is opaque, and thereby almost all of the light emitted by the light-emitting layer 53 travels to the photoelectric conversion unit 40 via the transparent part of the base substrate.

Similarly, in the present invention, the specific structure of the photoelectric conversion unit 40 is not specially defined, as long as the photoelectric conversion unit 40 can restore the optical signal sent by the electro-optical conversion unit 50 to the electrical signal which is the same as the electrical drive signal output by the driving circuit 20. For example, the photoelectric conversion unit 40 can include a photoelectric sensor, which can include a photoelectric diode and/or photoelectric triode.

Figure 5:
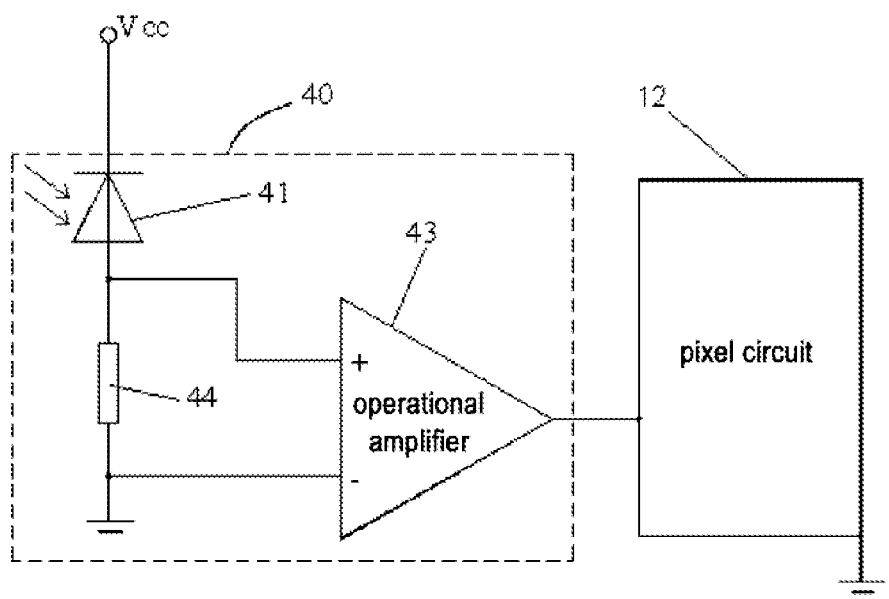
FIG. 5 is a circuit diagram showing a connection between the first implementation of the photoelectric conversion unit and a pixel circuit.

A first implementation of the photoelectric sensor in the photoelectric conversion unit 40 is shown in FIGS. 4 and 5, namely the photoelectric sensor is the photoelectric diode 41. When the photoelectric sensor is the photoelectric diode 41, the photoelectric conversion unit 40 can also include a signal amplification unit which is connected with the photoelectric diode and used for amplifying the electrical signal produced by the photoelectric diode 41, thereby ensuring that the electrical signal which is finally produced by the photoelectric conversion unit 40 is the same as the electrical drive signal which is originally input by the driving circuit 20.

As a specific implementation of the present invention, the photoelectric diode 41 includes a second anode 411, a PN junction 412 and a second cathode 413 which are sequentially arranged on the first surface of the base substrate from bottom to top, and an operational amplification unit can include an operational amplifier 43 and a first auxiliary resistor 44. The second anode 411 of the photoelectric diode 41 is arranged directly on the first surface, the second anode of the photoelectric diode 41 is connected with one terminal of the first auxiliary resistor 44, the second cathode of the photoelectric diode 41 is connected with a high-level power supply Vcc and the other terminal of the first auxiliary resistor 44 is grounded. A positive input terminal of the operational amplifier 43 is connected with the one terminal of the first auxiliary resistor 44, a negative input terminal of the operational amplifier 43 is connected with the other terminal of the first auxiliary resistor 44, and an input terminal of the pixel circuit 12 is connected with an output terminal of the operational amplifier 43.

The second anode 411 can be made of a transparent electrode material, such as ITO. The PN junction 412 can include a P area made of p type a-Si, an I area made of i type a-Si and an N area made of n type a-Si which are sequentially arranged from bottom to top. The second cathode 413 can be made of aluminum. The optical signal produced by the electro-optical conversion unit 50 passes through the transparent part and the second anode 411 and then shines on the PN junction 412. Due to the exposure to the optical signal, the P area is positively charged and the N area is negatively charged, consequently, a potential difference is formed between the P area and the N area of the PN junction, and the second anode 411 and the second cathode 413 are connected with the external pixel circuit 12 to produce current.

Specifically, without light irradiation, the high-level power supply Vcc outputs a high-level signal to the second cathode 413 of the photoelectric diode 41, thereby reversely turning off the photoelectric diode 41, resulting in a very small reverse current and making the output voltage across the first auxiliary resistor 44 almost 0. With light irradiation, after photons carrying energy enter the PN junction 412, the energy is transferred to bound electrons on covalent bonds, thereby enabling part of the electrons to escape from the covalent bonds and producing electron-hole pairs (namely, photo-generated carriers). At this time, the reverse current flowing through the photoelectric diode 41 significantly increases, and the voltage output from the first auxiliary resistor 44 significantly increases, thereby realizing the photoelectric conversion. A voltage signal output from the first auxiliary resistor 44 is amplified by the operational amplifier 43 and then transferred to the pixel circuit 12.

Figure 7:
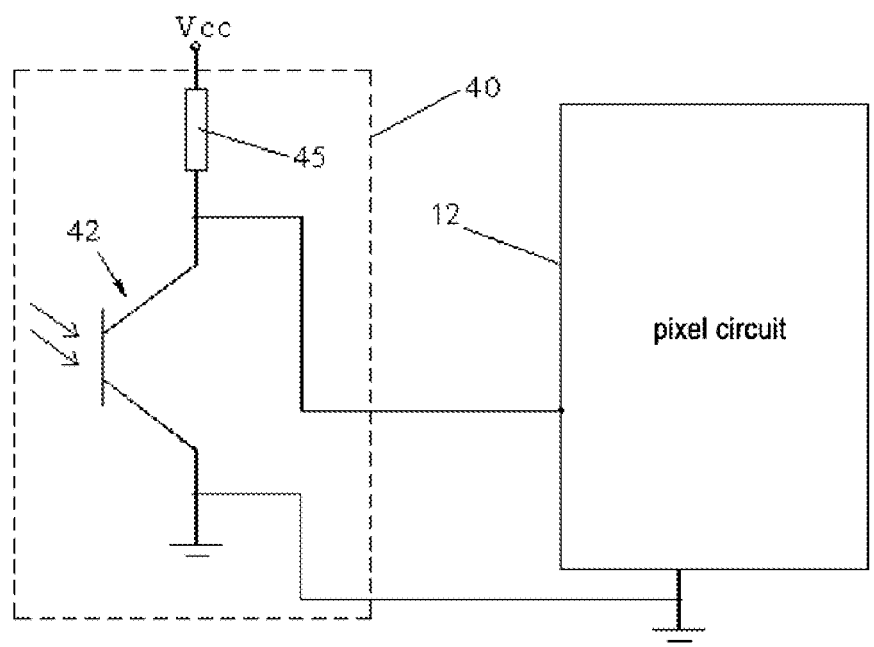
FIG. 7 is a circuit diagram showing a connection between the second implementation of the photoelectric conversion unit and the pixel circuit.

A second implementation of the photoelectric sensor in the photoelectric conversion unit 40 is shown in FIGS. 6 and 7, namely the photoelectric sensor is the photoelectric triode 42. In this implementation, the photoelectric triode 42 includes a source 421, a first organic photoelectric layer 422, a gate 423, a second organic photoelectric layer 424 and a drain 425 which are sequentially arranged on the first surface of the base substrate from bottom to top. As shown in FIG. 6, the source 421 is arranged directly on the first surface.

As shown in FIG. 7, in addition to the photoelectric triode 42, the photoelectric conversion unit 40 further includes a second auxiliary resistor 45. One terminal of the second auxiliary resistor 45 is connected with the high-level power supply Vcc and the other terminal is connected with the drain of the photoelectric triode 42. The source of the photoelectric triode 42 is arranged on the first surface, the source of the photoelectric triode 42 is connected with a grounding terminal of the pixel circuit 12 and the drain of the photoelectric triode 42 is connected with the input terminal of the pixel circuit 12.

The photoelectric triode 42 can realize not only photoelectric conversion, but also amplification of the electrical signal, thereby ensuring that the photoelectric conversion unit 40 can produce the electrical signal which is the same as the electrical drive signal originally input by the driving circuit 20.

In the present invention, the materials of all the layers of the photoelectric triode 42 are not limited. For example, the source 421 can be made of a transparent electrode material (such as ITO), the first organic photoelectric layer 422 and the second organic photoelectric layer 424 can be made of organic semiconductor material CuPc (copper phthalocyanine), and the gate 423 and the drain 425 can be made of metal aluminum. A Schottky barrier (or Schottky contact) can be formed between the gate 423 and the first organic photoelectric layer 422, as well as between the gate 423 and the second organic photoelectric layer 424. Without irradiation of the optical signal, no leak current is produced between the source and the drain of the photoelectric triode 42, and thus no current flows through the second auxiliary resistor 45. When the optical signal irradiates the contact surface between the gate 423 and the first organic photoelectric layer 422 and the contact surface between the gate 423 and the second organic photoelectric layer 424, light current is produced, the photoelectric triode 42 is driven to achieve a light current multiplication effect and thus the optical signal to electrical signal conversion is realized.

As another aspect of the present invention, there is provided a display panel, which includes an array substrate, wherein the array substrate is the above array substrate provided by the present invention.

Since the array substrate provided by the present invention has relatively high degree of integration, the display panel correspondingly has relatively high degree of integration and thus has a relatively small volume. The display panel can be used in display devices such as mobile phones, computers, tablet computers, televisions and the like.

Those skilled in the art should understand that the display panel further includes an opposite substrate which is arranged oppositely to the array substrate to form a cell. When the display panel is a liquid crystal display panel, a color filter can be arranged on the opposite substrate to form a color filter substrate.

In the present invention, the specific type of the display panel is not limited, for example, the display panel can be a reflective liquid crystal display panel; or the display panel includes a self-luminous display device (such as an OLED, a quantum dot light-emitting element or the like). In the above two situations, arrangement of the driving circuit on the back (namely, the second surface) of the base substrate of the array substrate will not affect the aperture ratio of the array substrate.

It can be understood that the above embodiments are merely the exemplary implementations adopted for describing the principle of the present invention, and the present invention is not limited thereto. Those of ordinary skill in the art can make various variations and improvements without departing from the spirit and essence of the present invention, and these variations and improvements are also deemed as falling within the protection range of the present invention.

The invention claimed is:

1. An array substrate, comprising a base substrate and a pixel circuit, the base substrate comprising a first surface and a second surface which is opposite to the first surface, the pixel circuit being arranged on the first surface of the base substrate, wherein the array substrate further comprises a driving circuit, which is arranged on the second surface of the base substrate and is in signal connection with the pixel circuit, wherein at least a part of the base substrate is a transparent part, the array substrate further comprises an electro-optical conversion unit arranged on the second surface of the base substrate and a photoelectric conversion unit arranged on the first surface of the base substrate, both the electro-optical conversion unit and the photoelectric conversion unit are arranged on the transparent part, the electro-optical conversion unit is electrically connected with the driving circuit to convert an electrical drive signal output by the driving circuit into an optical signal, and the photoelectric conversion unit is electrically connected with the pixel circuit and is capable of receiving the optical signal converted by the electro-optical conversion unit and restoring the optical signal to an electrical signal which is the same as the electrical drive signal output by the driving circuit, wherein the photoelectric conversion unit comprises a photoelectric triode and a second auxiliary resistor, one terminal of the second auxiliary resistor is connected with a high-level output terminal, the other terminal of the second auxiliary resistor is connected with a drain of the photoelectric triode, a source of the photoelectric triode is arranged on the first surface, the source of the photoelectric triode is connected with a grounding terminal of the pixel circuit and the drain of the photoelectric triode is connected with an input terminal of the pixel circuit.

2. The array substrate according to claim 1, wherein a wavelength of the optical signal is not less than that of infrared light.

3. The array substrate according to claim 1, wherein the electro-optical conversion unit comprises an electroluminescent element.

4. The array substrate according to claim 2, wherein the electro-optical conversion unit comprises an electroluminescent element.

5. The array substrate according to claim 3, wherein a first anode of the electroluminescent element is arranged on the second surface.

6. The array substrate according to claim 4, wherein a first anode of the electroluminescent element is arranged on the second surface.

7. The array substrate according to claim 1, wherein the photoelectric conversion unit comprises a photoelectric diode, and an operational amplifier and a first auxiliary resistor which are connected with the photoelectric diode, a second anode of the photoelectric diode is arranged on the first surface, the second anode of the photoelectric diode is connected with one terminal of the first auxiliary resistor, a second cathode of the photoelectric diode is connected with a high-level output terminal, the other terminal of the first auxiliary resistor is grounded, a positive input terminal of the operational amplifier is connected with the one terminal of the first auxiliary resistor, a negative input terminal of the operational amplifier is connected with the other terminal of the first auxiliary resistor, and an input terminal of the pixel circuit is connected with an output terminal of the operational amplifier.

8. The array substrate according to claim 2, wherein the photoelectric conversion unit comprises a photoelectric diode, and an operational amplifier and a first auxiliary resistor which are connected with the photoelectric diode, a second anode of the photoelectric diode is arranged on the first surface, the second anode of the photoelectric diode is connected with one terminal of the first auxiliary resistor, a second cathode of the photoelectric diode is connected with a high-level output terminal, the other terminal of the first auxiliary resistor is grounded, a positive input terminal of the operational amplifier is connected with the one terminal of the first auxiliary resistor, a negative input terminal of the operational amplifier is connected with the other terminal of the first auxiliary resistor, and an input terminal of the pixel circuit is connected with an output terminal of the operational amplifier.

9. The array substrate according to claim 1, wherein the driving circuit and the pixel circuit are electrically connected through a via hole penetrating through the base substrate.

10. A display panel, comprising an array substrate, wherein the array substrate is the array substrate according to claim 1.

11. The display panel according to claim 10, wherein the display panel is a reflective liquid crystal display panel; or the display panel comprises a self-luminous display device.

* * * * *